United States Patent
Park et al.

(10) Patent No.: US 12,463,061 B2
(45) Date of Patent: Nov. 4, 2025

(54) WAFER DRYING APPARATUS, WAFER PROCESSING SYSTEM INCLUDING THE SAME, AND WAFER PROCESSING METHOD USING THE SAME

(71) Applicant: SAMSUNG ELECTRONICS CO., LTD., Suwon-si (KR)

(72) Inventors: Sangjine Park, Suwon-si (KR); Jihoon Jeong, Seonnam-si (KR); Young-Hoo Kim, Yongin-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 771 days.

(21) Appl. No.: 17/590,263

(22) Filed: Feb. 1, 2022

(65) Prior Publication Data
US 2022/0406623 A1 Dec. 22, 2022

(30) Foreign Application Priority Data
Jun. 22, 2021 (KR) .................. 10-2021-0080917

(51) Int. Cl.
*H01L 21/67* (2006.01)
*H01L 21/02* (2006.01)

(52) U.S. Cl.
CPC .. *H01L 21/67034* (2013.01); *H01L 21/02101* (2013.01)

(58) Field of Classification Search
None
See application file for complete search history.

(56) References Cited

U.S. PATENT DOCUMENTS

| | | | |
|---|---|---|---|
| 7,044,662 B2 | 5/2006 | Arena-Foster et al. |
| 8,771,429 B2 | 7/2014 | Ji et al. |
| 8,950,082 B2 | 2/2015 | Sato et al. |
| 9,076,643 B2 | 7/2015 | Toshima et al. |
| 9,209,014 B2 | 12/2015 | Rathsack |
| 9,925,512 B2 | 3/2018 | Johnson et al. |
| 10,908,503 B2 | 2/2021 | Choi et al. |
| 10,915,025 B2 | 2/2021 | Fukumoto et al. |
| 2006/0065288 A1 | 3/2006 | Babic et al. |
| 2013/0145640 A1* | 6/2013 | Lee ................ H01L 21/67051 34/201 |
| 2019/0295843 A1 | 9/2019 | Yoo et al. |
| 2020/0026194 A1 | 1/2020 | Choi et al. |

(Continued)

FOREIGN PATENT DOCUMENTS

JP 2751849 B2 * 5/1998
JP 2013-55230 A 3/2013

(Continued)

*Primary Examiner* — Jason Lau
(74) *Attorney, Agent, or Firm* — Sughrue Mion, PLLC

(57) ABSTRACT

A wafer drying apparatus is disclosed. The wafer drying apparatus may include a drying chamber housing providing a drying space, in which a wafer is disposed, a supercritical fluid supplying part configured to supply a supercritical fluid into the drying space, a wafer heating part configured to heat the wafer disposed in the drying space, and a wafer cooling part configured to cool the wafer disposed in the drying space. The wafer cooling part may include a cooling plate disposed below a place, on which the wafer is loaded, and a cooling conduit inserted in the cooling plate.

7 Claims, 14 Drawing Sheets

(56) References Cited

U.S. PATENT DOCUMENTS

2020/0048515 A1* 2/2020 Kamada ................. H01L 24/32
2020/0081347 A1* 3/2020 Choi ................. H01L 21/68707

FOREIGN PATENT DOCUMENTS

| KR | 10-2013-0010826 A | | 1/2013 |
|---|---|---|---|
| KR | 20130064493 A | * | 6/2013 |
| KR | 10-1384320 B1 | | 4/2014 |
| KR | 10-2019-0002112 A | | 1/2019 |
| KR | 10-2020-0030653 A | | 3/2020 |
| KR | 20200074307 A | * | 6/2020 |

* cited by examiner

WAFER DRYING APPARATUS, WAFER PROCESSING SYSTEM INCLUDING THE SAME, AND WAFER PROCESSING METHOD USING THE SAME

CROSS-REFERENCE TO RELATED APPLICATIONS

This U.S. non-provisional patent application is based on and claims priority under 35 U.S.C. § 119 to Korean Patent Application No. 10-2021-0080917, filed on Jun. 22, 2021, in the Korean Intellectual Property Office, the entire contents of which are hereby incorporated by reference.

BACKGROUND

1. Field

The disclosure relates to a wafer drying apparatus, a wafer processing system including the same, and a wafer processing method using the same, and in particular, to a wafer drying apparatus, which is configured to dry a wafer using supercritical fluid, a wafer processing system including the same, and a wafer processing method using the same.

2. Description of the Related Art

A process of fabricating a semiconductor device includes various processes. For example, the semiconductor device may be fabricated through a photolithography process, an etching process, a deposition process, and a plating process. In the photolithography process, a drying process may be performed to remove a developing solution from a surface of a wafer. The developing solution may be removed by various methods. After the removal of the developing solution, a bake process of thermally treating the wafer may be performed. For the bake process, an apparatus of heating the wafer is needed. The heated wafer may be cooled for a subsequent process.

SUMMARY

An embodiment of the inventive concept provides a wafer drying apparatus, which is configured to prevent a reverse contamination issue, a wafer processing system including the same, and a wafer processing method using the same.

An embodiment of the inventive concept provides a wafer drying apparatus, which is configured to save a process time and a process space, a wafer processing system including the apparatus, and a wafer processing method using the same.

An embodiment of the inventive concept provides a wafer drying apparatus, which is configured to improve heating efficiency, a wafer processing system including the apparatus, and a wafer processing method using the same.

According to an aspect of the disclosure, there is provided a wafer drying apparatus, including: a drying chamber housing having a drying space; a supercritical fluid supplying part configured to supply a supercritical fluid into the drying space; a wafer heating part configured to heat a wafer provided in the drying space; and a wafer cooling part configured to cool the wafer provided in the drying space, wherein the wafer cooling part includes: a cooling plate provided below the wafer; and a cooling conduit inserted in the cooling plate.

According to another aspect of the disclosure, there is provided a wafer processing system, including: a wet chamber configured to treat a wafer with a developing solution; and a wafer drying apparatus including: a drying chamber housing configured to house the wafer unloaded from the wet chamber; a drying fluid supplying part configured to supply a drying fluid into an internal portion of the drying chamber housing; a wafer heating part configured to heat the wafer housed in the drying chamber housing; and a wafer cooling part configured to cool the wafer housed in the drying chamber housing.

According to another aspect of the disclosure, there is provided a wafer processing method, including: providing a wafer in a drying chamber housing; drying the wafer in the drying chamber housing; and heating the wafer, which is dried in the drying chamber housing, wherein the drying of the wafer in the drying chamber housing includes: supplying a drying fluid into the drying chamber housing using a drying fluid supplying part; removing a developing solution on the wafer from a surface of the wafer using the drying fluid; and discharging the drying fluid to an outside of the drying chamber housing.

DETAILED DESCRIPTION

Figure 1:
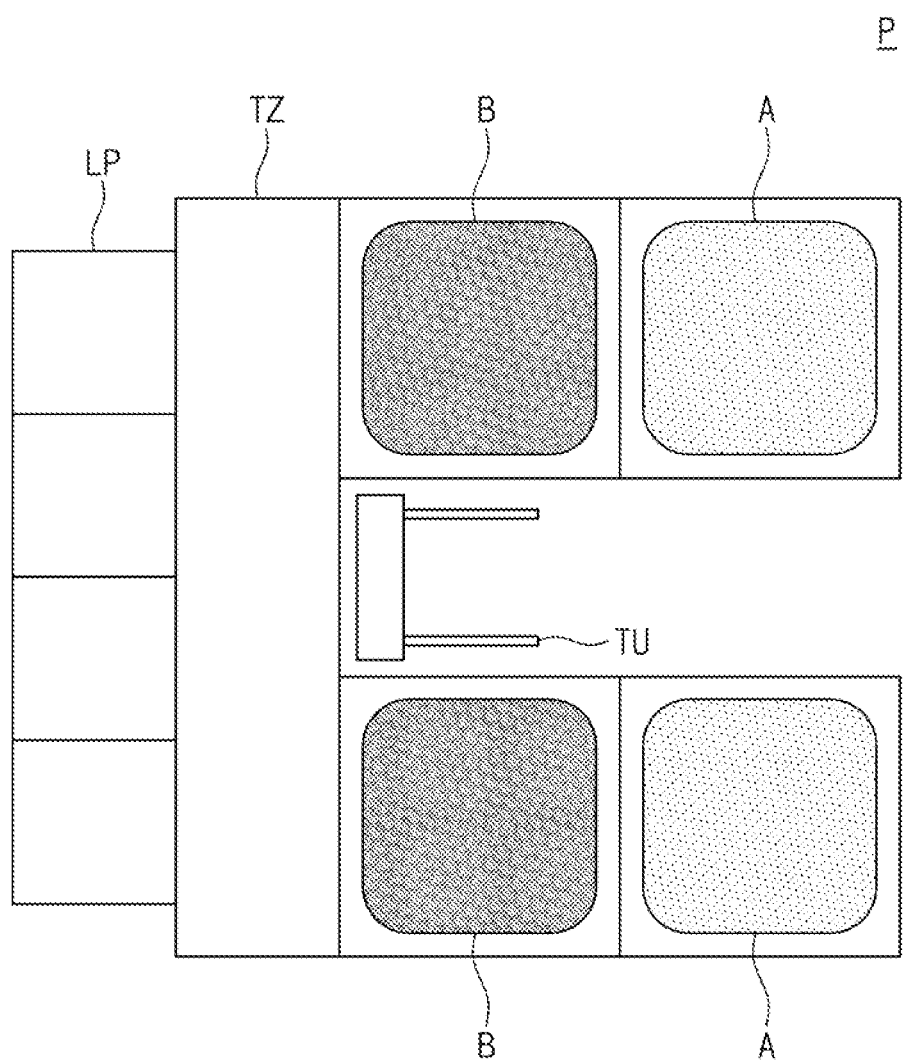
FIG. 1 is a diagram schematically illustrating a wafer processing system according to an example embodiment of the inventive concept.

Example embodiments of the inventive concepts will now be described more fully with reference to the accompanying drawings, in which example embodiments are shown. Like reference numerals in the drawings denote like elements, and thus their description will be omitted.

FIG. 1 is a diagram schematically illustrating a substrate processing system according to an example embodiment of the inventive concept.

Referring to FIG. 1, a wafer processing system P may be provided. The wafer processing system P may be a system that is configured to perform a process on a wafer. More specifically, the wafer processing system P may be a system that is configured to perform at least one operation of a photolithography process on a wafer. In the specification, the term 'wafer' may be used to represent a structure including a semiconductor wafer or the like. The wafer processing system P may be a system that is configured to perform a fabrication process on a wafer, which is coated with an exposed photoresist (PR) material. For example, the wafer processing system P may be a system that is configured to perform a process of coating developing solution on the wafer or to perform a drying and heating process on the wafer. In order to perform the fabrication process, the wafer processing system P may include a loading port LP, a transfer region TZ, a wet chamber B, a transfer unit TU, and a wafer drying apparatus A.

The loading port LP may be a port, on which the wafer is loaded. For example, the wafer, which is coated with an exposed photoresist (PR) material, may be loaded on the loading port LP. In an example embodiment, a plurality of the loading ports LP may be provided. A plurality of wafers may be loaded on each of the loading ports LP. However, in order to reduce complexity in the description and to provide better understanding of the inventive concept, one of the loading ports LP will be described exemplarily.

The transfer region TZ may be configured to transfer the wafer, which is loaded on the loading port LP. For example, the transfer unit TU may be used to transfer the wafer from the loading port to the wet chamber B and/or the wafer drying apparatus A. The transfer region TZ may be provided to face all of the loading ports LP.

The transfer unit TU may be configured to transfer the wafer. For example, the transfer unit TU may be configured to transfer the wafer from the loading port LP to the wet chamber B through the transfer region TZ. In addition, the transfer unit TU may be configured to unload the wafer from the wet chamber B and to transfer the wafer to the wafer drying apparatus A. For this, the transfer unit TU may include an actuator (e.g., a motor). In an example embodiment, the number of the transfer unit TU may be one, but the inventive concept is not limited to this example.

The wet chamber B may be configured to perform a developing process on the wafer. For example, if the wafer is disposed in the wet chamber B after the exposure process, the developing solution may be provided on the wafer. The developing solution may be provided in various manners. As an example, a spinner may be used to rotate the wafer, when the developing solution is sprayed onto a top surface of the wafer, and in this case, the developing solution may be formed to have a constant thickness on the wafer. However, the inventive concept is not limited to this example, and the developing solution may be provided by another method. The photoresist material on the wafer may be partially removed by the developing solution. As a result, photoresist patterns may be formed on the wafer. When the afore-described process in the wet chamber B is finished, there may be the developing solution left on the top surface of the wafer. In an example embodiment, the wafer processing system P may be configured to have a plurality of the wet chambers B. For example, a pair of the wet chamber B may be provided in the wafer processing system P. The pair of the wet chambers B may be disposed to face each other. However, in order to reduce complexity in the description and to provide better understanding of the inventive concept, one of the wet chambers B will be described exemplarily.

The wafer drying apparatus A may be configured to perform a drying process on the wafer. For example, the wafer drying apparatus A may be used to perform the drying process on the wafer unloaded from the wet chamber B. That is, the wafer drying apparatus A may be used to remove the developing solution from the wafer, which is unloaded from the wet chamber B and is covered with the developing solution. In addition, the wafer drying apparatus A may be configured to perform heating and/or cooling processes on the wafer. For example, the wafer drying apparatus A may be configured to perform the heating and/or cooling processes on the wafer, after the drying process on the wafer. That is, the wafer drying apparatus A may be configured to perform not only the drying process but also the heating and cooling processes on the wafer. The heating process, which is performed after the drying process on the wafer, may be a hard baking process. The wafer drying apparatus A may be placed near the wet chamber B. For example, the wafer drying apparatus A may be placed right next to the wet chamber B. In this case, the wafer may be quickly transferred from the wet chamber B to the wafer drying apparatus A by the transfer unit TU. In an example embodiment, the wafer processing system P may be configured to have a plurality of the wafer drying apparatuses A. For example, a pair of the wafer drying apparatuses A may be provided in the wafer processing system P. The pair of the wafer drying apparatuses A may be disposed to face each other. However, in order to reduce complexity in the description and to provide better understanding of the inventive concept, one of the wafer drying apparatuses A will be described exemplarily. The wafer drying apparatus A will be described in more detail with reference to FIG. 2.

Figure 2:
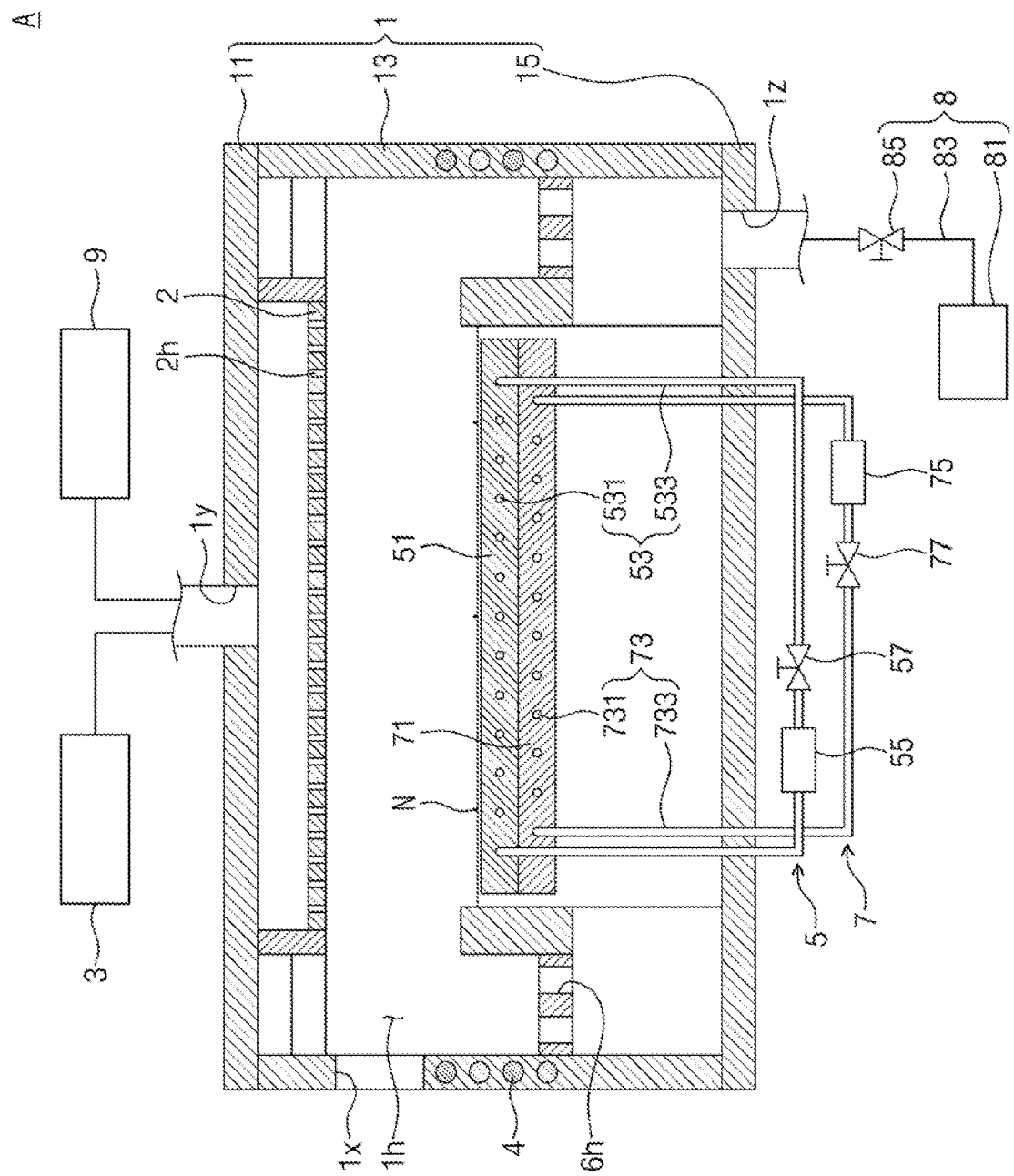
FIG. 2 is a sectional view illustrating a wafer drying apparatus according to an example embodiment of the inventive concept.

FIG. 2 is a sectional view illustrating a substrate drying apparatus according to an example embodiment of the inventive concept.

Referring to FIG. 2, the wafer drying apparatus A may include a drying chamber housing 1, a fluid distributing part 2, a drying fluid supplying part 3, a chamber heating part 4, a wafer heating part 5, a wafer cooling part 7, an exhausting part 8, and a gas supplying part 9.

The drying chamber housing 1 may be configured to have a drying space 1$h$. That is, the drying space 1$h$ may be defined by the drying chamber housing 1. The drying space 1$h$ may be a space, in which the drying process on the wafer is performed. The drying chamber housing 1 may include an upper member 11, a sidewall 13, and a lower member 15. The upper member 11 may be provided on the sidewall 13 to cover the sidewall 13. The upper member 11 may be provided to have a fluid injection hole 1$y$. Fluid and/or gas for the drying process may be supplied into the drying space 1$h$ through the fluid injection hole 1$y$. For this, the drying fluid supplying part 3 and/or the gas supplying part 9 may be connected to the fluid injection hole 1$y$. FIG. 2 illustrates an example embodiment in which the fluid injection hole 1$y$ is provided in the upper member 11, but the inventive concept is not limited to this example. For example, according to another example embodiment, the fluid injection hole 1$y$, which is used to supply the drying fluid and/or gas, may be provided in the lower member 15 or the sidewall 13. The sidewall 13 may be provided to have a wafer loading hole 1$x$. The wafer or the like may be inserted into the drying space 1$h$ through the wafer loading hole 1$x$. The lower member 15 may be provided below the sidewall 13 to support the sidewall 13. The lower member 15 may be provided to have an exhausting hole 1$z$. The exhausting hole 1$z$ may be connected to the exhausting part 8. The drying fluid and/or gas may be exhausted from the drying space 1$h$ to the exhausting part 8 through the exhausting hole 1$z$. FIG. 2 illustrates an example embodiment in which the exhausting hole 1z is provided in the lower member 15, but the inventive concept is not limited to this example. For example, according to another example embodiment, the exhausting hole 1z, which is used to exhaust the drying fluid and/or gas, may be provided in the upper member 11 or the sidewall 13.

The fluid distributing part 2 may be connected to the upper member 11. The fluid distributing part 2 may be configured to uniformly supply the drying fluid and the gas, which are respectively supplied from the drying fluid supplying part 3 and/or the gas supplying part 9, into the drying space 1h. For this, the fluid distributing part 2 may be provided to have a distribution hole 2h. The distribution hole 2h may be provided to vertically penetrate the fluid distributing part 2. In an example embodiment, the fluid distributing part 2 may be configured to have a plurality of the distribution holes 2h. The distribution holes 2h may be spaced apart from each other in a horizontal direction. The drying fluid and/or gas may be uniformly distributed to the entire region of the drying space 1h through the distribution holes 2h.

The drying fluid supplying part 3 may be connected to the drying chamber housing 1. More specifically, the drying fluid supplying part 3 may be connected to the fluid injection hole 1y. The drying fluid supplying part 3 may be configured to supply drying fluid to the drying space 1h. The wafer, which is disposed in the drying space 1h, may be dried by the drying fluid, which is supplied from the drying fluid supplying part 3. That is, the developing solution, which is formed on the wafer in the drying space 1h, may be removed from the wafer by the drying fluid. The drying fluid, which is supplied from the drying fluid supplying part 3, may have a very low surface tension. For example, the drying fluid may be supercritical fluid (SCF). More specifically, the drying fluid may be the supercritical fluid of carbon dioxide. In this case, the drying fluid supplying part 3 may be called a supercritical fluid supplying part 3. The drying fluid supplying part 3 will be described in more detail with reference to FIG. 3.

The chamber heating part 4 may be configured to heat an internal portion of the drying chamber housing 1. That is, the chamber heating part 4 may heat a material in the drying space 1h. The internal portion of the drying chamber housing 1 may be heated and maintained to a specific temperature or higher by the chamber heating part 4. For example, the internal portion of the drying chamber housing 1 may be heated to a temperature of about 40° C. to 70° C. by the chamber heating part 4. More specifically, the internal portion of the drying chamber housing 1 may be heated to about 60° C. or higher by the chamber heating part 4. Since the internal portion of the drying chamber housing 1 is maintained to the specific temperature or higher by the chamber heating part 4, the supercritical fluid supplied into the drying space 1h may be maintained to the supercritical state. The chamber heating part 4 may include various elements. For example, the chamber heating part 4 may include a heating wire and a power supplying part. The heating wire may be disposed in the sidewall 13. In this case, the drying space 1h may be heated by heat, which is generated in the heating wire by an electrical power supplied from the power supplying part. In an example embodiment, the chamber heating part 4 may include a heating fluid pipe and a heat exchanger. The heating fluid pipe may be placed in the sidewall 13. In this case, the drying space 1h may be heated by the heating fluid in the heating fluid pipe. FIG. 2 illustrates an example in which the chamber heating part 4 is placed in the sidewall 13, but the inventive concept is not limited to this example. In other words, unlike illustration shown in FIG. 2, the chamber heating part 4 may be placed at other position to heat the drying space 1h.

The wafer heating part 5 may be configured to heat the wafer. For example, the wafer heating part 5 may heat the wafer that is provided in the drying space 1h. The wafer heating part 5 may heat the wafer to a temperature of about 90° C. to about 110° C. A hard baking process on the wafer may be performed by the wafer heating part 5. The wafer heating part 5 may include a heating plate 51, a heating member 53, a heating heat exchanger 55, and a heating valve 57. The heating plate 51 may be provided at a place for heating the wafer. That is, the heating plate 51 may be provided below a place, where the wafer is placed. For example, the heating plate 51 may be placed below a wafer supporting member N on which the wafer is loaded. The heating plate 51 may be formed of a material having high thermal conductivity or the heating plate 51 may include a material having high thermal conductivity. For example, the heating plate 51 may be formed of or include a metallic material (e.g., copper (Cu) and aluminum (Al)). A width of the heating plate 51 may be greater than a width of the wafer. This will be described in more detail with reference to FIG. 7. The heating member 53 may be configured to heat the heating plate 51. In other words, if the heating plate 51 is heated by the heating member 53, the wafer may be heated by the heating plate 51. The heating member 53 may be provided in the form of a heating conduit, through which high temperature fluid flows. The heating member 53 may include an internal heating conduit 531 and a connection heating conduit 533. The internal heating conduit 531 may be inserted in the heating plate 51. The heating plate 51 may be heated by the high-temperature fluid flowing through the internal heating conduit 531. The connection heating conduit 533 may be connected to the internal heating conduit 531. More specifically, the connection heating conduit 533 may connect the internal heating conduit 531 to the heating heat exchanger 55. After the heat exhausting process of the fluid in the internal heating conduit 531, the fluid may be sent from the internal heating conduit 531 to the heating heat exchanger 55 through the connection heating conduit 533. The heating heat exchanger 55 may be configured to re-heat the fluid that is cooled by the heat exhausting process in the internal heating conduit 531. According to an example embodiment, the heating heat exchanger 55 may include various elements. For example, the heating heat exchanger 55 may include a heating wire or a boiler, which is used to heat the fluid in the connection heating conduit 533. The heating heat exchanger 55 may be placed outside the heating plate 51. That is, the heating heat exchanger 55 may be spaced apart from the heating plate 51. More specifically, the heating heat exchanger 55 may be placed outside the drying chamber housing 1. The heating valve 57 may be placed on the connection heating conduit 533. The heating valve 57 may be opened or closed to control the flow of the high-temperature fluid from the heating heat exchanger 55.

The wafer cooling part 7 may be configured to cool the wafer. For example, the wafer cooling part 7 may lower the temperature of the wafer that is provided in the drying space 1h. In other words, the temperature of the wafer, which is heated by the wafer heating part 5, may be lowered by the wafer cooling part 7. The wafer cooling part 7 may include a cooling plate 71, a cooling conduit 73, a cooling heat exchanger 75, and a cooling valve 77. The cooling plate 71 may be provided at a place for cooling the wafer. That is, the cooling plate 71 may be provided below the wafer. For example, the cooling plate 71 may be placed below the wafer supporting member N on which the wafer is loaded. More specifically, the cooling plate 71 may be placed below the heating plate 51. However, the inventive concept is not limited to this example, and the relative position of the cooling plate 71 to the heating plate 51 may be changed. The cooling plate 71 may be formed of or include a material having high thermal conductivity. For example, the cooling plate 71 may be formed of or include at least one of metallic materials (e.g., copper (Cu) and aluminum (Al)). A width of the cooling plate 71 may be larger than the width of the wafer. This will be described in more detail with reference to FIG. 7. The cooling conduit 73 may be used to cool the cooling plate 71. That is, if the cooling plate 71 is cooled by the cooling conduit 73, the wafer may be cooled by the cooling plate 71. Low temperature fluid for the cooling process may flow through the cooling conduit 73. The cooling conduit 73 may include an internal cooling conduit 731 and a connection cooling conduit 733. The internal cooling conduit 731 may be inserted in the cooling plate 71. The cooling plate 71 may be cooled by the low temperature fluid flowing through the internal cooling conduit 731. The connection cooling conduit 733 may be connected to the internal cooling conduit 731. More specifically, the connection cooling conduit 733 may connect the internal cooling conduit 731 to the cooling heat exchanger 75. After the cooling (i.e., heat-absorbing) process of the fluid in the internal cooling conduit 731, the fluid may be sent from the internal cooling conduit 731 to the cooling heat exchanger 75 through the connection cooling conduit 733. The cooling heat exchanger 75 may be configured to cool the fluid that is heated by the heat-absorbing process in the internal cooling conduit 731. For this, the cooling heat exchanger 75 may include various elements. For example, the cooling heat exchanger 75 may include a freezing cycle, a low temperature fluid supply tank, a heat-absorbing plate, or the like, which is used to quench the fluid supplied through the connection cooling conduit 733. The cooling heat exchanger 75 may be placed outside the cooling plate 71. In other words, the cooling heat exchanger 75 may be spaced apart from the cooling plate 71. More specifically, the cooling heat exchanger 75 may be placed outside the drying chamber housing 1. The cooling valve 77 may be placed on the connection cooling conduit 733. The cooling valve 77 may be opened or closed to control the flow of the low-temperature fluid from the cooling heat exchanger 75.

The exhausting part 8 may be configured to exhaust the fluid from the drying space 1h. For this, the exhausting part 8 may be connected to the exhausting hole 1z. Thus, the fluidic materials, which are supplied from the drying fluid supplying part 3 and/or the gas supplying part 9, may be discharged to the exhausting part 8 through a separation hole 6h and the exhausting hole 1z. The exhausting part 8 may include an exhausting tank 81, an exhausting line 83, and an exhausting valve 85. The exhausting tank 81 may be configured to store fluid exhausted from the drying space 1h. The exhausting line 83 may connect the exhausting hole 1z to the exhausting tank 81. The exhausting valve 85 may be placed on the exhausting line 83. The exhausting valve 85 may be configured to open or close the exhausting line 83 and thereby to control the exhaust of the fluid in the drying space 1h.

The gas supplying part 9 may be configured to supply the gas into the internal portion of the drying chamber housing 1. More specifically, the gas supplying part 9 may be configured to supply inactive gas into the drying space 1h. For example, the inactive gas (e.g., carbon dioxide ($CO_2$) and/or nitrogen ($N_2$)) may be supplied into the drying space 1h by the gas supplying part 9. For this, the gas supplying part 9 may include a gas supplying source, a compressor, and a gas conduit. The gas supplying source may be configured to store and supply the inactive gas (e.g., carbon dioxide ($CO_2$) and/or nitrogen ($N_2$)). The compressor may be configured to compress or transfer the inactive gas. The gas conduit may be used to transfer the inactive gas from the gas supplying source to the drying chamber housing 1. The gas supplying part 9 may be connected to the fluid injection hole 1y. FIG. 2 illustrates an example in which the gas supplying part 9 and the drying fluid supplying part 3 are provided as separate elements, but the inventive concept is not limited to this example. For example, the gas supplying part 9 and the drying fluid supplying part 3 may constitute a single element. In this case, a gaseous material may be supplied into the drying space 1h by controlling the drying fluid supplying part 3.

Figure 3:
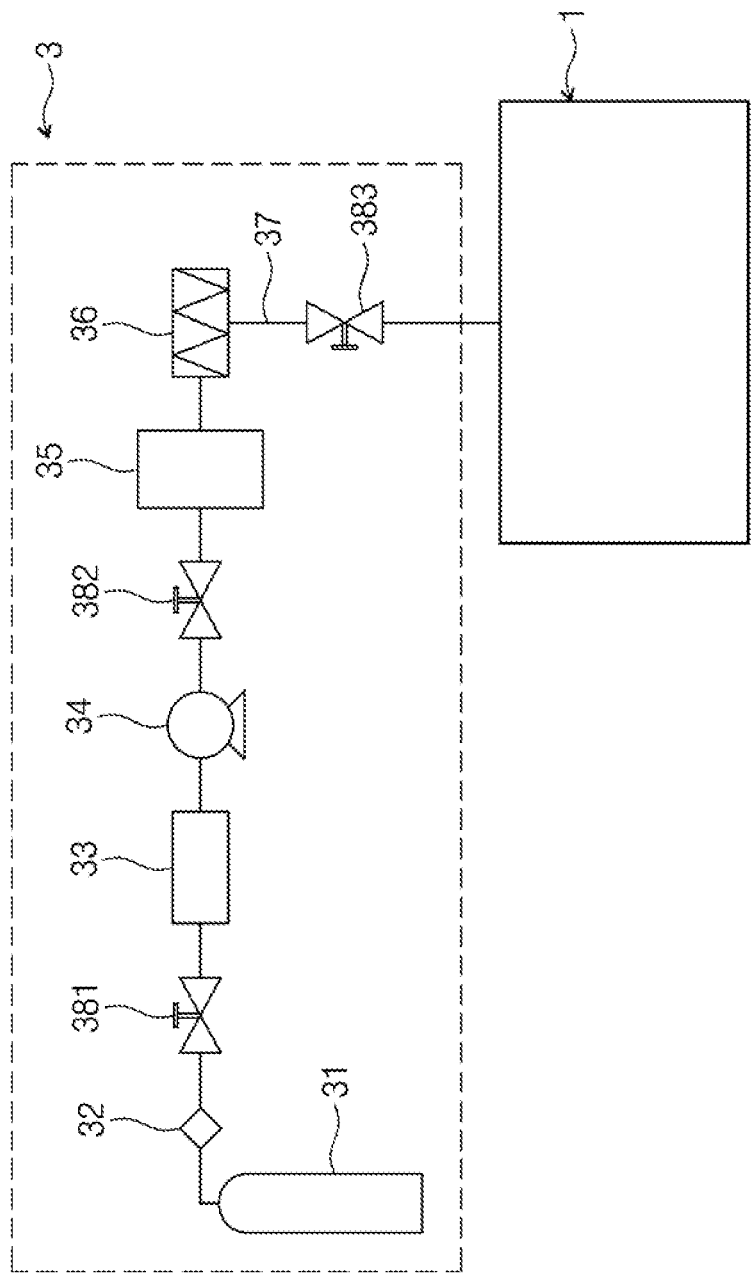
FIG. 3 is a diagram schematically illustrating a drying fluid supplying part and a drying chamber housing, according to an example embodiment of the inventive concept.

FIG. 3 is a diagram schematically illustrating a drying fluid supplying part and a drying chamber housing, according to an example embodiment of the inventive concept.

Referring to FIG. 3, the drying fluid supplying part 3 may include a drying fluid supplying source 31, a drying fluid line 37, a filter 32, a first valve 381, a condenser 33, a pump 34, a second valve 382, a tank 35, a heater 36, and a third valve 383.

The drying fluid supplying source 31 may be configured to supply a drying fluid. More specifically, the drying fluid supplying source 31 may be configured to store and supply a gaseous fluid, which will be transformed to a supercritical fluid. In the case where the drying fluid is supercritical carbon dioxide ($CO_2$), the drying fluid supplying source 31 may store gas of carbon dioxide. Temperature of the carbon dioxide gas, which is supplied by the drying fluid supplying source 31 may range from about 10° C. to 30° C. In addition, pressure of the carbon dioxide gas supplied by the drying fluid supplying source 31 may range from about 4 MPa to 6 MPa. The drying fluid supplied from the drying fluid supplying source 31 may flow through the drying fluid line 37.

The drying fluid line 37 may be used as a path to supply the drying fluid from the drying fluid supplying source 31 to the drying chamber housing 1. The filter 32 may be placed on the drying fluid line 37. The filter 32 may be configured to remove a contamination material in the drying fluid. The first valve 381 may be configured to open or close a conduit between the filter 32 and the condenser 33 and thereby to control the flow of the drying fluid.

The condenser 33 may be configured to cool the carbon dioxide gas, which is supplied from the drying fluid supplying source 31. For example, the carbon dioxide gas may be liquefied by the condenser 33. For example, the temperature of the carbon dioxide liquefied by the condenser 33 may range from about 0° C. to 6° C. In addition, the pressure of the carbon dioxide liquefied by the condenser 33 may range from about 4 MPa to 6 MPa.

The pump 34 may be configured to increase the pressure of the drying fluid liquefied by the condenser 33. For example, the pressure of the carbon dioxide liquefied by the condenser 33 may be increased to a range from about 15 MPa to 25 MPa by the pump 34. In addition, the temperature of the carbon dioxide liquefied by the condenser 33 may be increased to a range from about 15° C. to 25° C., while passing through the pump 34. The second valve 382 may be configured to open or close a conduit between the pump 34 and the tank 35 and thereby to control the flow of the drying fluid. The tank 35 may be configured to store the drying fluid compressed by the pump 34.

The heater 36 may be configured to heat the drying fluid flowing through the drying fluid line 37. More specifically, the heater 36 may be used to heat the liquefied carbon dioxide, which is compressed by the pump 34. As a result of this heating process, the liquefied carbon dioxide may become a supercritical state. The carbon dioxide, which is heated by the heater 36 to be in a supercritical state, may be in a high-temperature high-pressure state. For example, the temperature of the carbon dioxide, which is in the supercritical state while flowing through the heater 36, may range from about 60° C. to about 90° C. In addition, the pressure of the carbon dioxide, which is in the supercritical state while flowing through the heater 36, may range from about 15 MPa to about 25 MPa. The third valve 383 may be configured to control the flow of the carbon dioxide, which is in the supercritical state while flowing through the heater 36. The carbon dioxide in the supercritical state may pass through the third valve 383 and may be supplied into the drying chamber housing 1.

Figure 4:
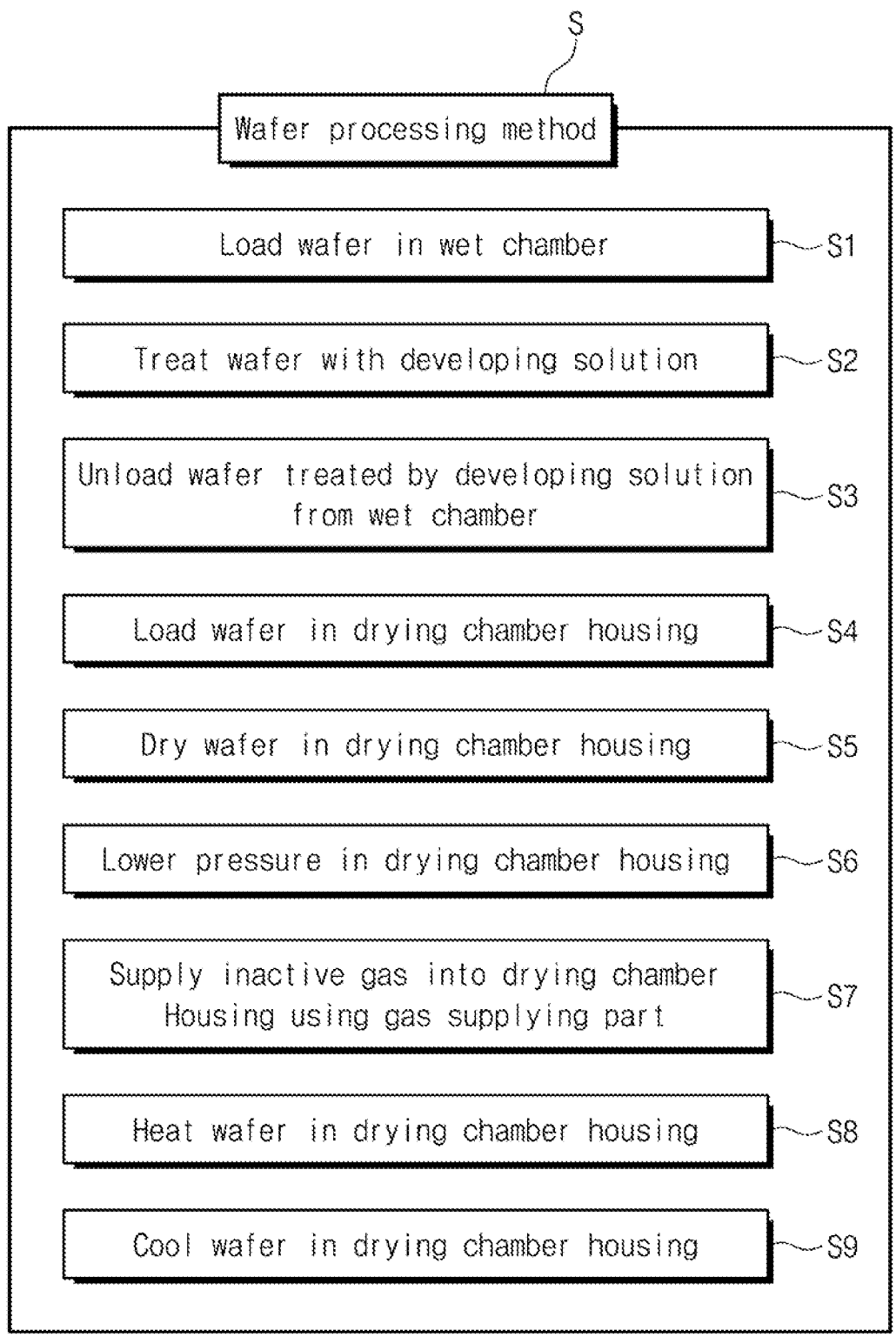
FIG. 4 is a flow chart illustrating a wafer processing method according to an example embodiment of the inventive concept.

FIG. 4 is a flow chart illustrating a substrate processing method according to example embodiment of the inventive concept.

Referring to FIG. 4, a wafer processing method S may be provided. The wafer processing method S may mean a method of drying, heating and/or cooling a wafer using the wafer processing system P described with reference to FIGS. 1 to 3. The wafer processing method S may include loading a wafer in a wet chamber (in S1), treating the wafer with developing solution (in S2), unloading the wafer treated by the developing solution from the wet chamber (in S3), loading the wafer in a drying chamber housing (in S4), drying the wafer in the drying chamber housing (in S5), lowering pressure in the drying chamber housing (in S6), supplying an inactive gas into the drying chamber housing using a gas supplying part (in S7), heating the wafer in the drying chamber housing (in S8), and cooling the wafer in the drying chamber housing (in S9).

Hereinafter, each operation in the wafer processing method S of FIG. 4 will be described in more detail with reference to FIGS. 5 to 12.

Figure 5:
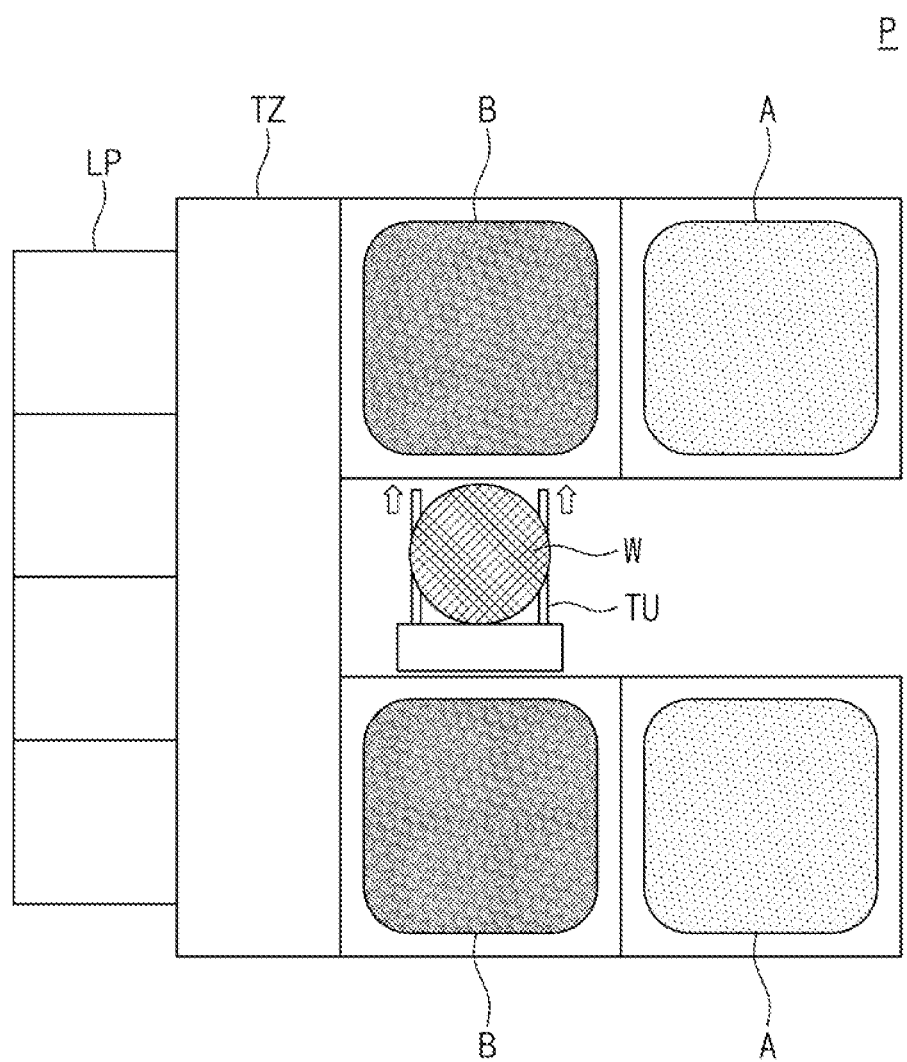
FIGS. 5 and 6 are schematic diagrams of a wafer processing system, which are presented to illustrate some operations of the wafer processing method according to the flow chart of FIG. 4.

FIG. 5 is a schematic diagram of a wafer processing system, which is presented to illustrate some operations of the wafer processing method according to the flow chart of FIG. 4.

Referring to FIGS. 4 and 5, the loading of the wafer in the wet chamber (in S1) may include transferring a wafer W, which is loaded on the loading port LP, into the wet chamber B using the transfer unit TU. The wafer W, which is placed in the wet chamber B, may be a wafer covered with an exposed photoresist (PR) layer.

The treating of the wafer with the developing solution (in S2) may be performed in the wet chamber B. More specifically, the developing solution may be supplied onto the wafer W in the wet chamber B. As described above, the supplying of the developing solution onto the wafer W may be performed in various manners. For example, the developing solution may be sprayed onto the top surface of the wafer W, which is in rotational motion caused by a spinner, to form the developing solution on the wafer W to a uniform thickness. However, the inventive concept is not limited to this example, and the developing solution may be supplied onto the wafer W by other methods according to other example embodiments. Portions of the photoresist (PR) layer on the wafer W may be removed by the developing solution. That is, the photoresist (PR) layer may be patterned.

The unloading of the wafer treated by the developing solution from the wet chamber (in S3) may include unloading the wafer W from the wet chamber B using the transfer unit TU. In an example embodiment, there may be at least a portion of the developing solution on the wafer W, which is unloaded from the wet chamber B.

Figure 6:
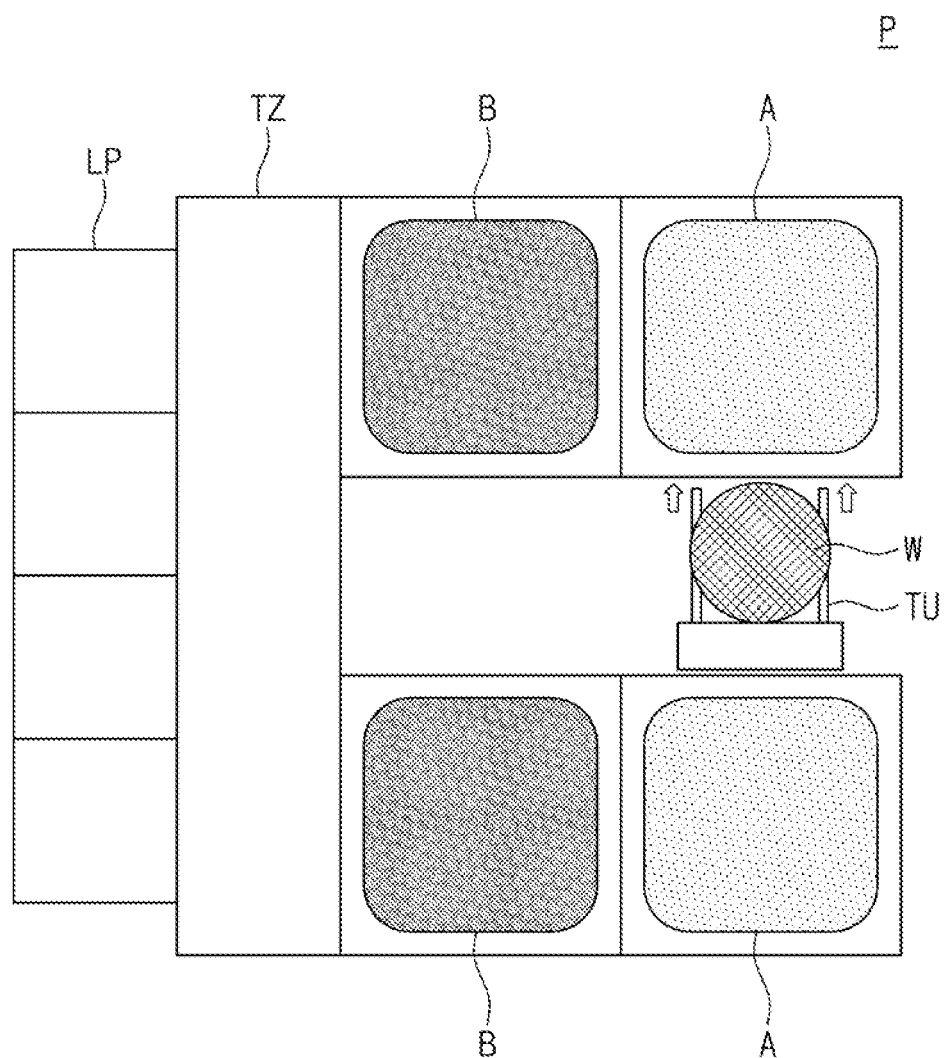

FIG. 6 is a schematic diagram of a wafer processing system, which is presented to illustrate some operations of the wafer processing method according to the flow chart of FIG. 4, and FIGS. 7 to 10 are sectional views of a wafer drying apparatus, which are presented to illustrate some operations of the wafer processing method according to the flow chart of FIG. 4.

Figure 7:
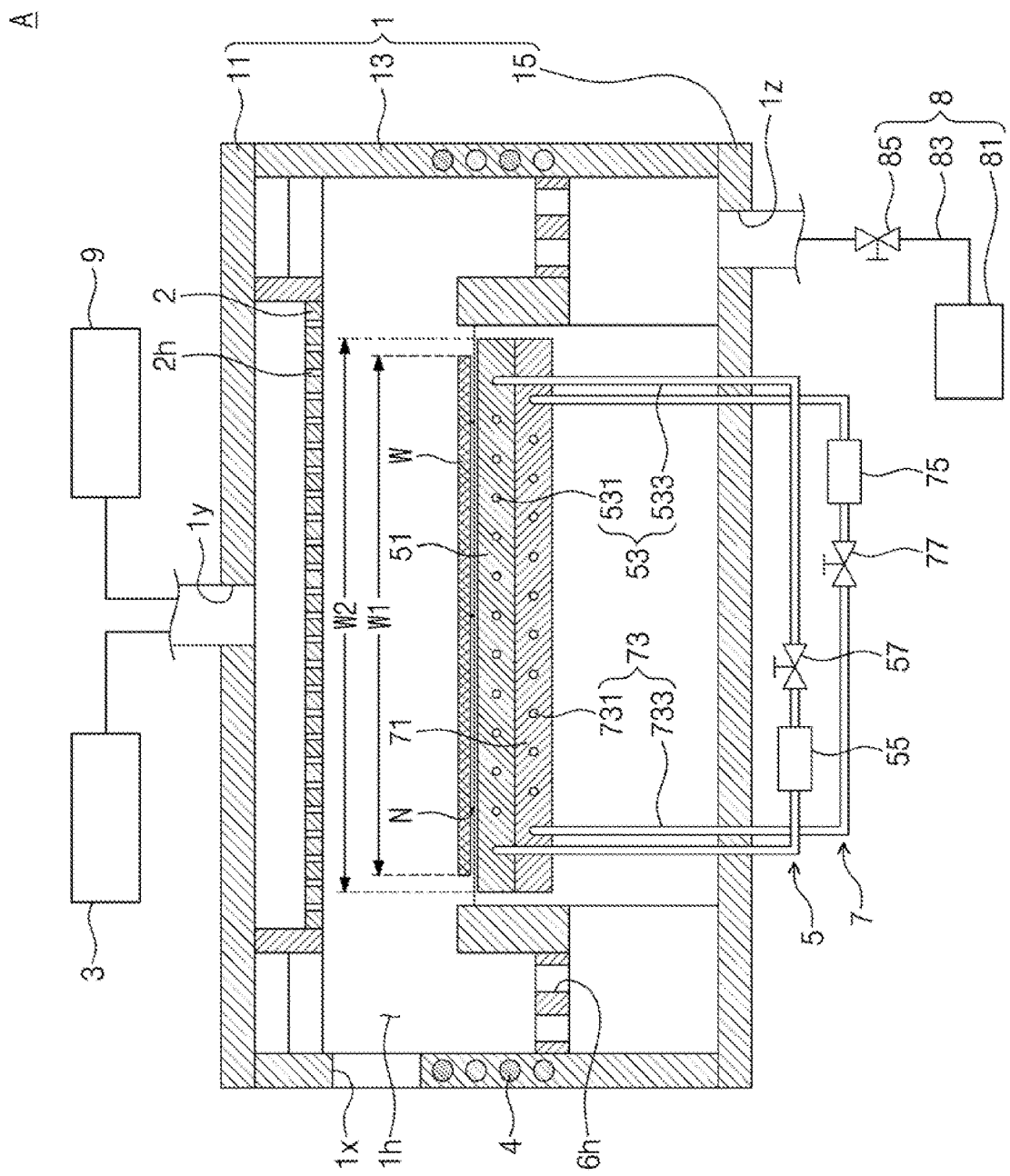
FIGS. 7 to 10 are sectional views of a wafer drying apparatus, which are presented to illustrate some operations of the wafer processing method according to the flow chart of FIG. 4.

Referring to FIGS. 4, 6, and 7, the loading of the wafer in the drying chamber housing (in S4) may include placing the wafer W in the wafer drying apparatus A using the transfer unit TU. More specifically, the wafer W, which is unloaded from the wet chamber B, may be transferred to the drying chamber housing by the transfer unit TU and may be loaded in the drying chamber housing, as shown in FIG. 7. There may be the developing solution covering the wafer W, when the wafer W is transferred by the transfer unit TU. The wafer W may be placed in the drying space 1h. For example, the wafer W may be placed on the heating plate 51 and/or the cooling plate 71. More specifically, the wafer W may be placed on the wafer supporting member N. The wafer supporting member N may be a vertically-extended pin-shaped element. In an example embodiment, a plurality of the wafer supporting members N may be provided to support the wafer W. The wafer W may be vertically spaced apart from the heating plate 51 and/or the cooling plate 71 by a specific distance by the wafer supporting member N. As described above, the width of the wafer W may be smaller than a width of each of the heating plate 51 and/or the cooling plate 71. For example, if the width of the wafer W is a first width W1 and the width of the heating plate 51 is a second width W2, the second width W2 may be larger than the first width W1. Accordingly, an edge region of the wafer W may also be effectively heated and cooled.

Figure 8:
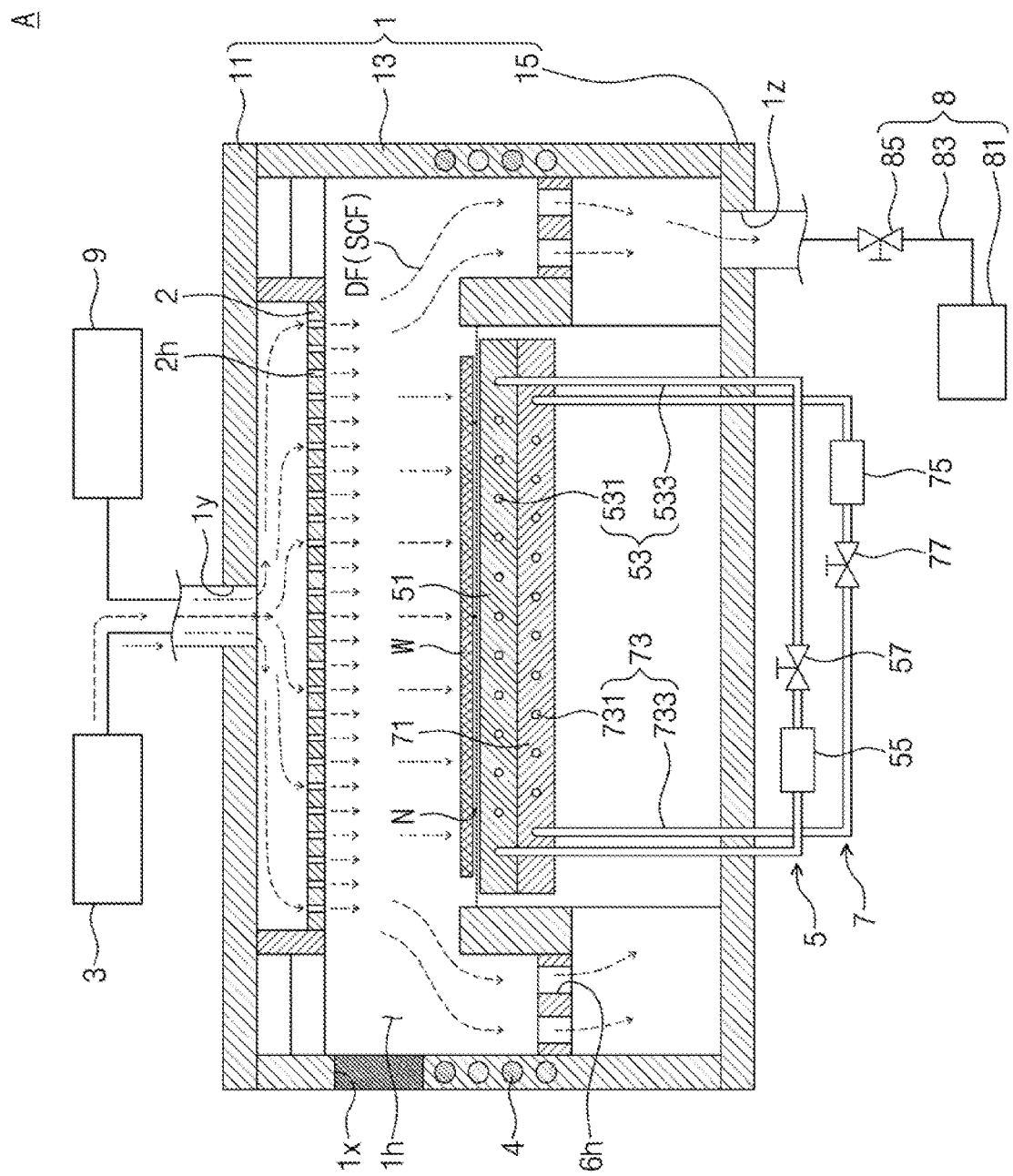

Referring to FIGS. 4 and 8, the drying of the wafer in the drying chamber housing (in S5) may include supplying drying fluid DF into the drying space 1h using the drying fluid supplying part 3. For example, the drying fluid DF, which is supplied from the drying fluid supplying source 31 (e.g., see FIG. 3), be in a supercritical state, when it is supplied into the drying space 1h. In the case where the drying fluid DF is in the supercritical state, the drying fluid DF may be called 'supercritical fluid SCF'. The supercritical fluid SCF, which is supplied into the drying space 1h, may be supplied onto the wafer W in a uniformly distributed manner by the fluid distributing part 2. As illustrated in FIG. 8, the loading hole 1x may be closed after the wafer is loaded on the wafer supporting N.

The drying of the wafer in the drying chamber housing (in S5) may further include removing the developing solution from the surface of the wafer W using the drying fluid DF. The removing of the developing solution from the surface of the wafer W may include reacting the developing solution with the drying fluid DF and pushing out the developing solution from the surface of the wafer W using the drying fluid DF. That is, a portion of the developing solution on the wafer W may be reacted with the drying fluid DF and may be dissolved in the drying fluid DF, and another portion of the developing solution on the wafer W may be pushed out from the surface of the wafer W by the pressure of the drying fluid DF. Accordingly, the developing solution may be removed from the surface of the wafer W.

The drying of the wafer in the drying chamber housing (in S5) may further include heating the internal portion of the drying chamber housing 1. More specifically, the drying fluid DF in the drying space 1h may be heated by the chamber heating part 4. Accordingly, the internal portion of the drying chamber housing 1 may be heated to a temperature of about 40° C. to 70° C. More specifically, the internal portion of the drying chamber housing 1 may be heated to about 60° C. or higher by the chamber heating part 4. Thus, the supercritical fluid SCF, which is supplied into the drying space 1h, may be maintained to its supercritical state.

The drying of the wafer in the drying chamber housing (in S5) may further include discharging the drying fluid DF to the outside of the drying chamber housing 1. More specifically, the drying fluid DF, along with the developing solution removed from the surface of the wafer W, may be exhausted to the exhausting part 8 through the separation hole 6h and the exhausting hole 1z. While the drying fluid DF, which is supplied into the drying space 1h, along with the developing solution removed from the wafer W, is exhausted to the exhausting part 8, new drying fluid DF may be unceasingly supplied into the drying space 1h, and the heating process by the chamber heating part 4 may be performed. That is, according to an example embodiment, the afore-described processes may be performed simultaneously. As a result of this process, the developing solution may be removed from the surface of the wafer W. In other words, the wafer W may be dried.

The lowering of the pressure in the drying chamber housing (in S6) may include interrupting the supplying of the drying fluid DF to lower the pressure in the drying space 1h. As a result of the interruption of the supplying of the drying fluid DF, the pressure in the drying space 1h may be lowered to a level close to the atmospheric pressure.

Figure 9:
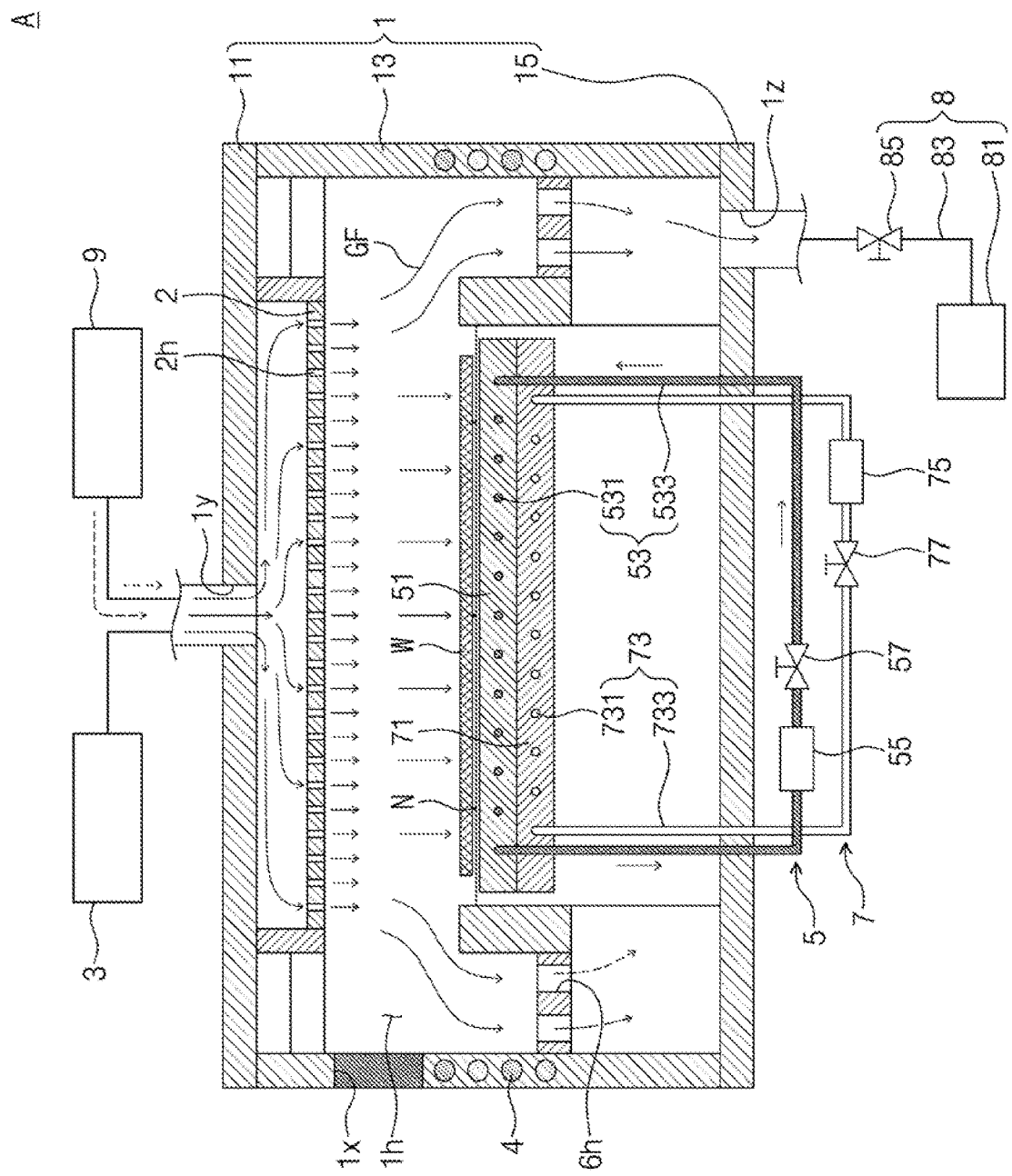

Referring to FIGS. 4 and 9, the supplying of the inactive gas into the drying chamber housing using the gas supplying part (in S7) may include supplying an inactive gas GF (e.g., carbon dioxide ($CO_2$) and/or nitrogen ($N_2$)) into the drying space 1h using the gas supplying part 9. The inactive gas GF, which is supplied into the drying space 1h, along with a contamination material near the wafer W, may be exhausted to the exhausting part 8. Thus, it may be possible to remove the contamination material from a region near the wafer W. The contamination material may include an organic material, which is produced from the wafer W by the developing solution. Since the inactive gas GF is used to remove the contamination material from the wafer W, it may be possible to prevent the wafer W from being contaminated by the contamination material or to prevent a reverse contamination issue from occurring on the wafer W. In addition, the drying space 1h and the wafer W may be cooled by the inactive gas GF. That is, the temperature of the wafer W may be lowered by the inactive gas GF.

The heating of the wafer in the drying chamber housing (in S8) may include heating the wafer W using the wafer heating part 5. More specifically, heating fluid, which is heated to a high temperature by the heating heat exchanger 55, may flow through the heating member 53, and as a result, the heating plate 51 may be heated by the heating fluid. The heating plate 51, which is heated to a high temperature by the heating fluid, may exhaust heat energy to neighboring elements. Accordingly, the wafer W may be heated. For example, the wafer W may be heated to a temperature of about 90° C. to about 110° C. The heating of the wafer W may be performed as a part of the hard baking process on the wafer W. The developing solution left on the wafer W may be removed, while the wafer W is heated. In addition, the photoresist (PR) layer on the wafer W may be cured by the heating of the wafer W. In an example embodiment, the photoresist (PR) layer on the wafer W may be strongly combined to an oxide layer by the heating of the wafer W. The heating of the wafer W by the wafer heating part 5 may be performed for about 60 seconds. The inactive gas GF from the gas supplying part 9 may be supplied into the drying chamber housing unceasingly (e.g., without interruption) during the heating of the wafer W by the wafer heating part 5.

Figure 10:
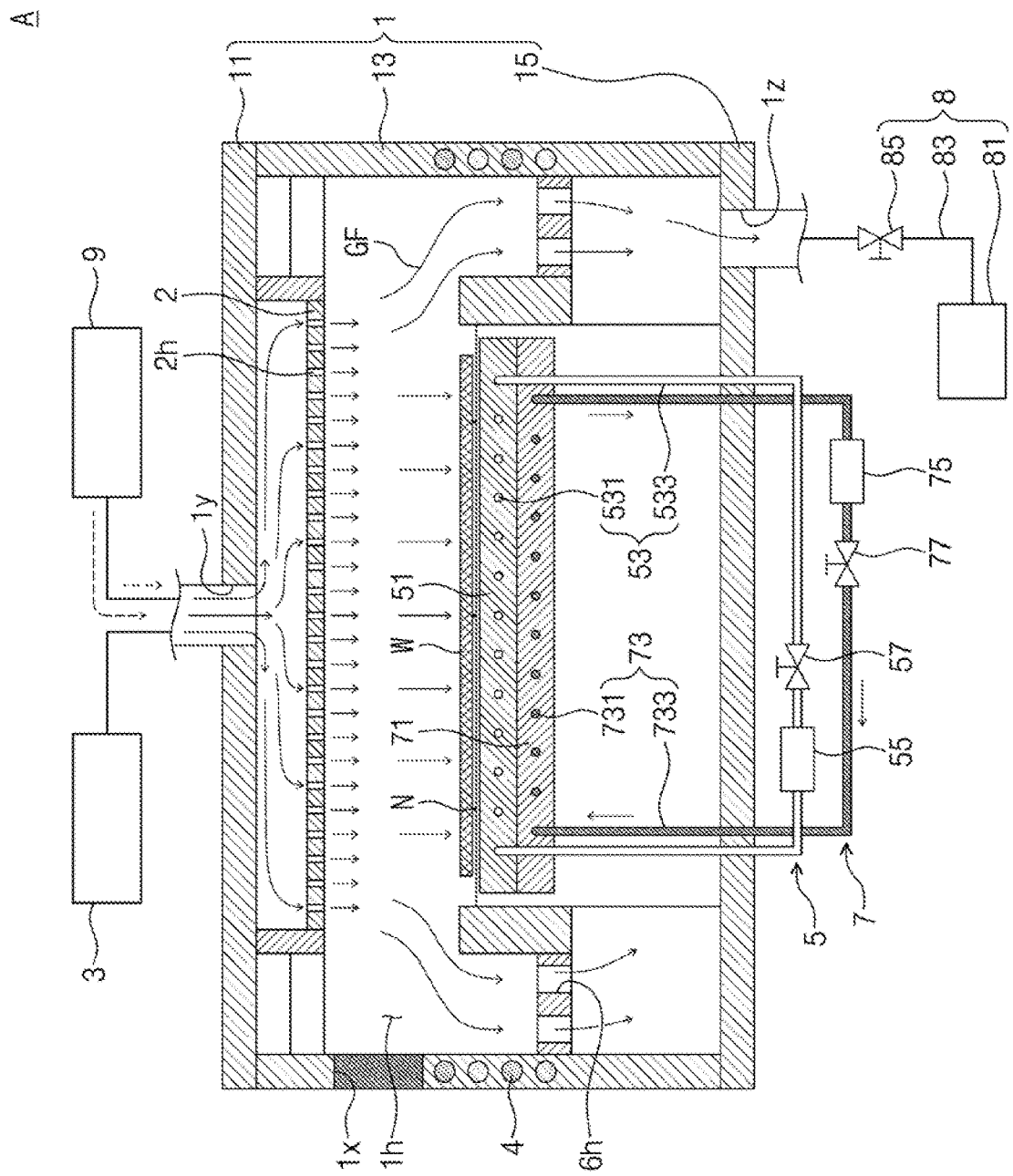

Referring to FIGS. 4 and 10, the cooling of the wafer in the drying chamber housing (in S9) may include cooling the wafer W using the wafer cooling part 7. More specifically, cooling fluid, which is cooled to a low temperature by the cooling heat exchanger 75, may flow through the cooling conduit 73, and as a result, the cooling plate 71 may be cooled by the cooling fluid. The cooling plate 71, which is cooled to a low temperature by the cooling fluid, may absorb heat energy from the neighboring elements. Accordingly, the wafer W may be cooled. The temperature of the wafer W may be lowered to about room temperature. As a result of the cooling of the wafer W, the unloading of the wafer W from the drying chamber may be allowed. The inactive gas GF from the gas supplying part 9 may be supplied into the drying chamber housing unceasingly (e.g., without interruption) during the cooling of the wafer W by the wafer cooling part 7.

The above description refers to an example, in which the heating and cooling processes are sequentially performed on the wafer W after the supplying of the inactive gas GF by the gas supplying part 9, but the inventive concept is not limited to this example. According to another example embodiment, the supplying of the inactive gas GF by the gas supplying part 9 may be performed only when the cooling process is performed on the wafer W after the heating process is finished. In an example embodiment, the supplying of the inactive gas GF by the gas supplying part 9 may be performed after the heating process on the wafer W is finished, and the cooling process on the wafer W may be performed after the supplying of the inactive gas GF is finished. In an example embodiment, the heating and cooling processes on the wafer W may be sequentially performed, after the supplying of the inactive gas GF by the gas supplying part 9 is finished. In any case, when the cooling process on the wafer W is performed, a contamination material near the wafer W may be removed by the inactive gas, and thus, it may be possible to prevent the wafer W from being contaminated by the contamination material or to prevent a reverse contamination issue, during the cooling process on the wafer W.

Figure 11:
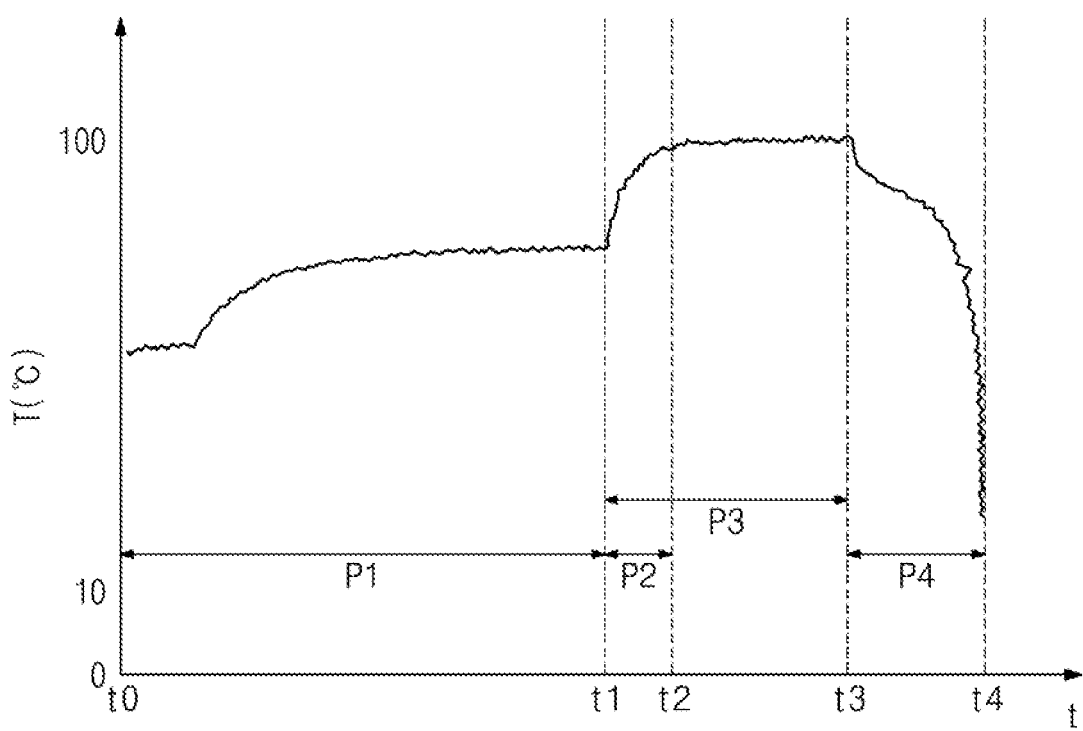
FIG. 11 is a graph showing time-temperature characteristics in the wafer processing method according to the flow chart of FIG. 4.
Figure 12:
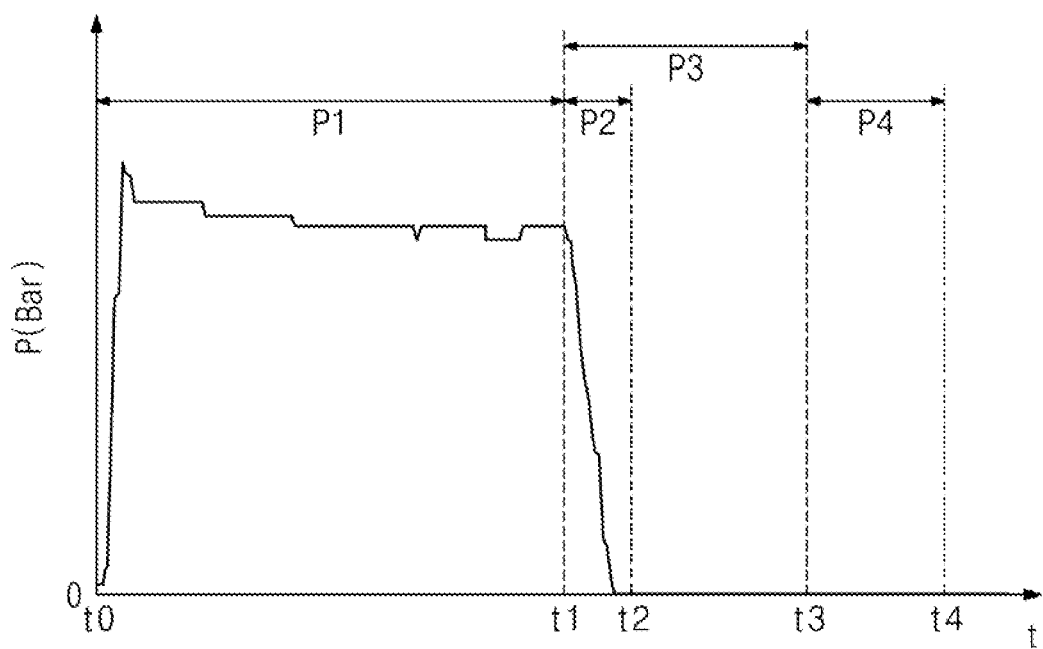
FIG. 12 is a graph showing time-pressure characteristics in the wafer processing method according to the flow chart of FIG. 4.

FIG. 11 is a graph showing time-temperature characteristics in the wafer processing method according to the flow chart of FIG. 4, and FIG. 12 is a graph showing time-pressure characteristics in the wafer processing method according to the flow chart of FIG. 4.

In FIG. 11, the horizontal axis may represent a process time. The time $t_0$ on the horizontal axis may represent a starting time of the process. In FIG. 11, the vertical axis may represent temperature of the drying space or the wafer therein during the process. In FIG. 11, the interval P1 may correspond to the operation (S5) of drying the wafer in the drying chamber housing, described with reference to FIG. 4. During the interval P1, the drying fluid DF may be supplied into the drying space 1h by the drying fluid supplying part 3, and in this case, the temperature of the drying space 1h may be increased. In addition, the temperature of the drying space 1h may be increased and/or maintained by the chamber heating part 4. The interval P2 may correspond to the operation (S6) of lowering the pressure of the drying chamber housing, described with reference to FIG. 4. The interval P2 may start at the time t1 when the interval P1 is finished. The interval P2 may be finished at the time t2. The interval P3 may correspond to the operation (S8) of heating the wafer in the drying chamber housing, described with reference to FIG. 4. That is, the temperature of the wafer W may be increased by the wafer heating part 5. The temperature of the wafer W may be increased to about 90° C. to 110° C. and may be maintained. The interval P3 may start at the time t1 at which the interval P1 is finished. Thus, the interval P3 may be partially overlapped with the interval P2. The interval P4 may correspond to the operation (S9) of cooling the wafer in the drying chamber housing, described with reference to FIG. 4. During the interval P3, the temperature of the wafer W may be lowered by the wafer cooling part 7. The temperature of the wafer W may be lowered to the room temperature. The interval P4 may start at the time t3 at which the interval P3 is finished. In addition, the interval P4 may be finished at the time t4.

Referring to FIG. 12, the horizontal axis may represent a process time. The time t0 on the horizontal axis represents a process starting time. The vertical axis may represent an internal pressure of the drying space during the process. The pressure of the vertical axis may represent a relative pressure to the atmospheric pressure. For example, the pressure 0 on the vertical axis may represent the atmospheric pressure of about 1 atm. During the interval P1, the drying fluid DF may be supplied into the drying space 1h by the drying fluid supplying part 3, and in this case, the pressure of the drying space 1h may be increased. During the interval P2, the drying fluid DF may be exhausted from the drying space 1h, and in this case, the pressure of the drying space 1h may be lowered. For example, the pressure of the drying space 1h may be lowered to a level close to the atmospheric pressure at time, when the interval P2 is finished. During the intervals P3 and P4, the pressure may be maintained to the level close to the atmospheric pressure. For example, the inactive gas GF may be supplied into the drying space 1h by the gas supplying part 9 to maintain the pressure of the drying space 1h to the level close to the atmospheric pressure.

In a wafer drying apparatus according to an example embodiment of the inventive concept, a wafer processing system including the same, and a wafer processing method using the same, the supercritical fluid and the chamber heating part may be used to heat the wafer to a specific temperature, and then, the wafer heating part may be used to further heat the wafer. Thus, it may be possible to improve efficiency in the heating process. That is, the wafer may be heated to a specific temperature, during the interval P1 as shown in the graph of FIG. 11, and then, a main heating process may be performed on the heated. Accordingly, it may be possible to improve the efficiency in the heating process or to reduce a process time taken to heat the wafer to a desired temperature.

In a wafer drying apparatus according to an example embodiment of the inventive concept, a wafer processing system including the same, and a wafer processing method using the same, since the drying and heating processes are sequentially performed on the wafer in a wafer drying apparatus, an additional chamber for heating the wafer may not be required. Thus, it may be possible to reduce a total volume of the wafer processing system. In addition, since it is unnecessary to transfer the wafer to an additional chamber, the process time may be reduced. Furthermore, it may be possible to prevent a wafer-contamination issue, which may occur when the wafer is transferred to the additional chamber. Accordingly, a process yield may be increased.

In a wafer drying apparatus according to an example embodiment of the inventive concept, a wafer processing system including the same, and a wafer processing method using the same, when the wafer is cooled, an inactive gas may be used to remove a contamination material from the wafer. Thus, it may be possible to prevent the contamination material from being adsorbed on the wafer during the cooling process or to prevent the reverse contamination issue from occurring on the wafer.

Figure 13:
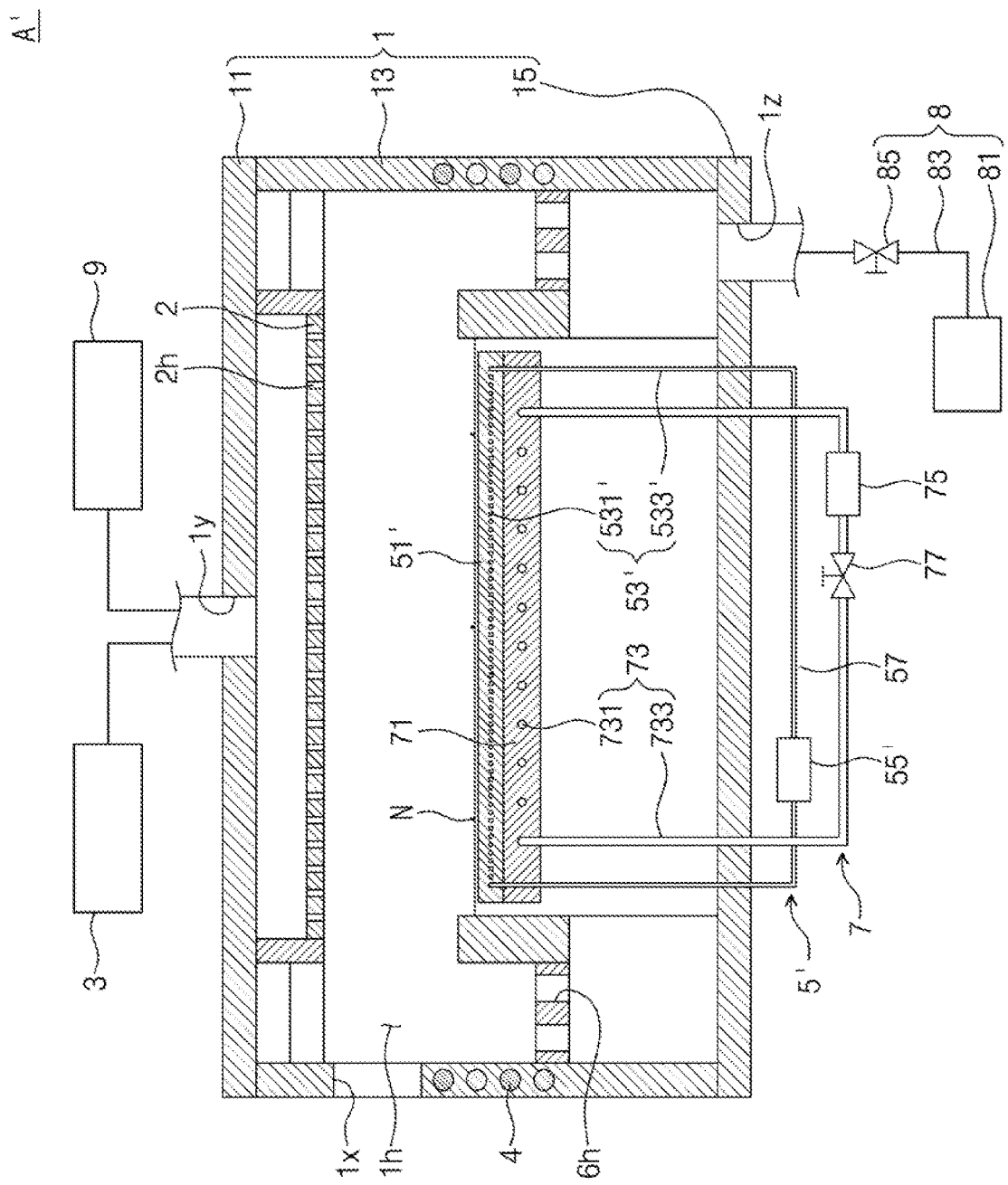
FIG. 13 is a sectional view illustrating a wafer drying apparatus according to an example embodiment of the inventive concept.

FIG. 13 is a sectional view illustrating a wafer drying apparatus according to an example embodiment of the inventive concept.

In the following description, the features of the semiconductor package, which are overlapped with those described with reference to FIGS. 1 to 12, will be omitted.

Referring to FIG. 13, a wafer drying apparatus A' may include a wafer heating part 5'. The wafer heating part 5' may include a heating plate 51', a heating member 53', and a power supplying part 55'. The heating plate 51' may be configured to have substantially the same or similar features as the heating plate 51 described with reference to FIG. 2. However, unlike the heating member 53 described with reference to FIG. 2, the heating member 53' of FIG. 13 may include a heating wire, which is formed of a metallic material to produce heat when an electric current flows therethrough. The heating member 53' may include an internal heating wire 531' and a connection heating wire 533'. The internal heating wire 531' may be placed in the heating plate 51'. The connection heating wire 533' may connect the internal heating wire 531' to the power supplying part 55'. The power supplying part 55' may be configured to supply an electric current to the heating member 53'. Unlike the wafer heating part 5 described with reference to FIG. 2, the wafer heating part 5' of FIG. 13 may heat the wafer using resistance heat, not using the heating fluid.

Figure 14:
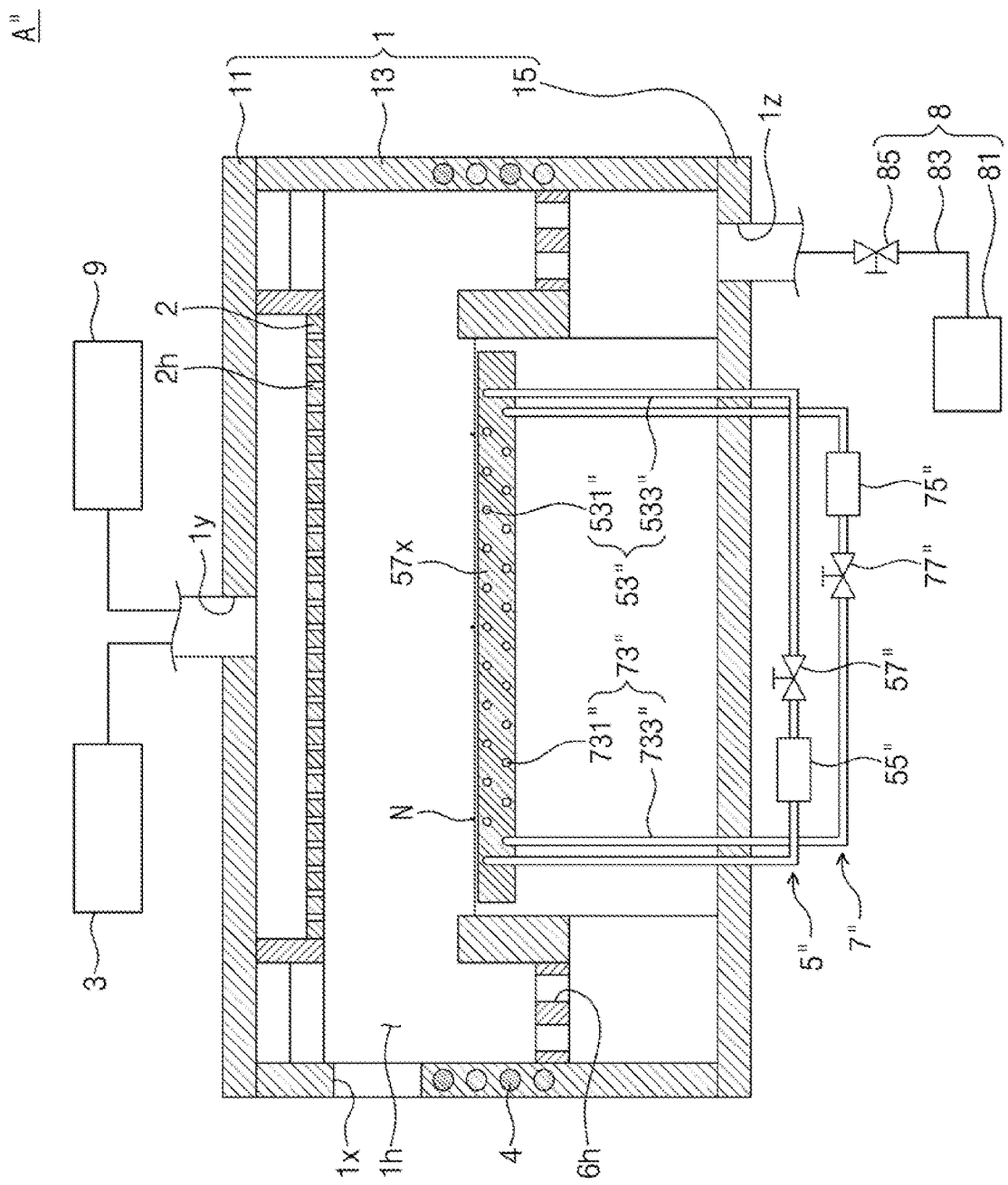
FIG. 14 is a sectional view illustrating a wafer drying apparatus according to an example embodiment of the inventive concept.

FIG. 14 is a sectional view illustrating a substrate drying apparatus according to an example embodiment of the inventive concept.

In the following description, the features of the semiconductor package, which are overlapped with those described with reference to FIGS. 1 to 13, will be omitted.

Referring to FIG. 14, a wafer drying apparatus A" may include a wafer heating part 5" and a wafer cooling part 7". However, unlike the wafer heating part 5 described with reference to FIG. 2, the wafer heating part 5" and the wafer cooling part 7" of FIG. 14 may share a plate 57x. In other words, both of an internal heating conduit 531" and an internal cooling conduit 731" may be inserted into the single plate 57x.

In a wafer drying apparatus, a wafer processing system including the same, and a wafer processing method using the same according to an example embodiment of the inventive concept, it may be possible to prevent a reverse contamination issue.

In a wafer drying apparatus, a wafer processing system including the same, and a wafer processing method using the same according to an example embodiment of the inventive concept, it may be possible to reduce time and space for a process of drying or processing a wafer.

In a wafer drying apparatus, a wafer processing system including the same, and a wafer processing method using the same according to an example embodiment of the inventive concept, it may be possible to improve heating efficiency in a process of drying a wafer.

While example embodiments of the inventive concept have been particularly shown and described, it will be understood by one of ordinary skill in the art that variations in form and detail may be made therein without departing from the spirit and scope of the attached claims.

What is claimed is:

1. A wafer processing method, comprising:
   providing a wafer in a drying chamber housing;
   drying the wafer in the drying chamber housing;
   after drying the wafer, lowering a pressure in the drying chamber housing;
   after lowering the pressure, supplying an inactive gas into the drying chamber housing; and
   after supplying the inactive gas, heating the wafer in the drying chamber housing,
   wherein the drying of the wafer in the drying chamber housing comprises:
      supplying a drying fluid into the drying chamber housing using a drying fluid supplying part;
      removing a developing solution on the wafer from a surface of the wafer using the drying fluid; and
      discharging the drying fluid to an outside of the drying chamber housing,
   wherein the lowering the pressure in the drying chamber housing comprises interrupting the supplying of the drying fluid,
   wherein the supplying the inactive gas into the drying chamber housing comprises removing a contamination material from a region near the wafer, and
   wherein the lowering the pressure, the supplying the inactive gas and the heating the wafer are performed while the wafer remains in the drying chamber housing after the drying of the wafer.

2. The wafer processing method of claim 1, wherein the removing of the developing solution from the wafer using the drying fluid comprises:
   reacting the developing solution with the drying fluid; and
   pushing out the developing solution from the surface of the wafer using pressure from the drying fluid.

3. The wafer processing method of claim 1, wherein the drying of the wafer in the drying chamber housing further comprises heating an internal portion of the drying chamber housing.

4. The wafer processing method of claim 1, wherein the heating of the wafer comprises heating the wafer to a temperature of 90° C. to 110° C.

5. The wafer processing method of claim 1, further comprising cooling the wafer in the drying chamber housing, after the heating of the wafer.

6. The wafer processing method of claim 5, wherein the cooling of the wafer comprises flowing a cooling fluid through a cooling conduit, which is inserted in a cooling plate below the wafer to cool the wafer.

7. The wafer processing method of claim 5, wherein the inactive gas is supplied into the drying chamber housing using a gas supplying part.

* * * * *